(12) United States Patent
Nguyen et al.

(10) Patent No.: US 9,412,629 B2
(45) Date of Patent: Aug. 9, 2016

(54) WAFER BONDING FOR 3D DEVICE PACKAGING FABRICATION

(71) Applicant: GLOBALFOUNDRIES INC., Grand Cayman (KY)

(72) Inventors: Son V. Nguyen, Schenectady, NY (US); Vamsi K. Paruchuri, Clifton Park, NY (US); Deepika Priyadarshini, Guilderland, NY (US); Tuan A. Vo, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 227 days.

(21) Appl. No.: 13/658,856

(22) Filed: Oct. 24, 2012

(65) Prior Publication Data

US 2014/0113433 A1    Apr. 24, 2014

(51) Int. Cl.
*H01L 21/00* (2006.01)
*H01L 21/67* (2006.01)
*H01L 23/00* (2006.01)
(Continued)

(52) U.S. Cl.
CPC .......... *H01L 21/67092* (2013.01); *H01L 24/74* (2013.01); *H01L 24/80* (2013.01); *H01L 25/50* (2013.01); *H01L 27/0688* (2013.01); *H01L 2224/75251* (2013.01);
(Continued)

(58) Field of Classification Search
CPC .............. H01L 21/67092; H01L 2224/75251; H01L 2224/75252; H01L 2224/75303; H01L 2224/80209; H01L 2224/94; H01L 24/74; H01L 24/80; H01L 25/50; H01L 27/0688

USPC ................ 156/351, 358, 359, 556, 580, 581; 257/E21.211, E21.567; 438/455
See application file for complete search history.

(56) References Cited

U.S. PATENT DOCUMENTS 4,818,323 A    4/1989    D'Aragona et al.
4,939,101 A    7/1990    Black et al.
(Continued)

FOREIGN PATENT DOCUMENTS

JP    2004207436    7/2004
JP    2009064827    3/2009
(Continued)

OTHER PUBLICATIONS

Anonymous, "Method for the use of an autoclave for improved wafer bonding and increased manufacturing throughput", Mar. 13, 2002, www.ip.com No. IPCOM000007312D, pp. 1-4.

*Primary Examiner* — George Koch
(74) *Attorney, Agent, or Firm* — Yuanmin Cai; Hoffman Warnick LLC (57) ABSTRACT

An apparatus and method bond a first wafer to a second wafer. The apparatus includes a first pressure application device configured to apply pressure at a central region of the first wafer in a direction toward the second wafer to initiate a bonding process between the first wafer and the second wafer. The apparatus also includes one or more second pressure application devices configured to apply pressure between the central region and an outer edge of the first wafer to complete the bonding process. The one or more second pressure application devices apply pressure on the first wafer after the first pressure application device has initiated the bonding process and while the first pressure application device continues to apply pressure at the central region. A controller controls the first pressure application device and the one or more second pressure application devices.

12 Claims, 12 Drawing Sheets

(51) Int. Cl.
   *H01L 25/00* (2006.01)
   *H01L 27/06* (2006.01)

(52) U.S. Cl.
   CPC ............... *H01L 2224/75252* (2013.01); *H01L 2224/75303* (2013.01); *H01L 2224/80209* (2013.01); *H01L 2224/94* (2013.01)

(56) References Cited

U.S. PATENT DOCUMENTS

| | | | |
|---|---|---|---|
| 5,256,599 A | 10/1993 | Asetta et al. | |
| 2007/0190674 A1* | 8/2007 | Lee | H01L 51/5237 438/21 |
| 2007/0287264 A1* | 12/2007 | Rogers | 438/457 |
| 2008/0136955 A1 | 6/2008 | Kathman et al. | |
| 2008/0210383 A1* | 9/2008 | Hirata | H01L 21/67092 156/498 |
| 2009/0317960 A1* | 12/2009 | Izumi | 438/455 |
| 2011/0083786 A1* | 4/2011 | Guo et al. | 156/64 |
| 2011/0217795 A1* | 9/2011 | Tanida et al. | 438/16 |
| 2012/0068355 A1 | 3/2012 | Aoki et al. | |

FOREIGN PATENT DOCUMENTS

| | | |
|---|---|---|
| JP | 20100034445 | 2/2010 |
| KR | 20120054252 | 5/2012 |

* cited by examiner

WAFER BONDING FOR 3D DEVICE PACKAGING FABRICATION

BACKGROUND

The present invention relates to three-dimensional (3D) device packaging fabrication, and more specifically, to wafer to wafer bonding.

Three-dimensional (3D) integrated circuits are chips with two or more layers of active electronic components integrated both vertically and horizontally. This stacking of components (wafers) can reduce cycle time, increase frequency and chip performance, allow more active components to be placed per unit volume, and require fewer pins to communicate among the layers, thereby simplifying the packaging. However, successful 3D integration depends on the strength of the bond between the wafers, because subsequent grinding and chemical mechanical planarization (CMP) steps put stress on the bonds.

Existing wafer bonding techniques apply pressure on the top or bottom or both wafers to press them together. One previous technique involves the application of pressure at the center of the top wafer, pushing it down onto the bottom wafer. Another involves applying pressure at the center of both the top and bottom wafers. Yet another involves applying uniform pressure (several pressure points along the surface) to the top and bottom. However, these techniques leave voids (trapped air) between the wafers that represent areas of incomplete bonding. This incomplete bonding increases the vulnerability of the 3D IC to high mechanical stresses.

SUMMARY

According to one embodiment, an apparatus to bond a first wafer to a second wafer includes a first pressure application device configured to apply pressure at a central region of the first wafer in a direction toward the second wafer to initiate a bonding process between the first wafer and the second wafer; one or more second pressure application devices configured to apply pressure between the central region and an outer edge of the first wafer to complete the bonding process, wherein the one or more second pressure application devices apply pressure on the first wafer after the first pressure application device has initiated the bonding process and while the first pressure application device continues to apply pressure at the central region; and a controller configured to control the first pressure application device and the one or more second pressure application devices.

According to another embodiment, a method of bonding a first wafer to a second wafer includes applying pressure, with a first pressure application device, at a central region of the first wafer in a direction toward the second wafer to initiate a bonding process between the first wafer and the second wafer, and applying pressure, with one or more second pressure application devices, between the central region and an outer edge of the first wafer to complete the bonding process, wherein applying pressure with the one or more second pressure application devices is after bond initiation with the first pressure application device and applying pressure with the first pressure application device continues at the central region during the applying pressure with the one or more second pressure application devices.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Incomplete bonding (voids) between wafers of a 3D IC creates vulnerabilities to mechanical stresses. To address the problems created by incomplete bonding, several different embodiments of wafer bonding apparatus and techniques are detailed below.

FIGS. 1-6 depict a wafer bonding apparatus 100 at various stages of a wafer bonding process according to an embodiment. The apparatus 100 includes a pin 110 surrounded by concentric rings 120. The pin 110, disposed substantially near a center of a first wafer (not shown) (top wafer in the exemplary arrangement of FIGS. 1-6), is first lowered (FIG. 2) to apply pressure on the top wafer. The pin 110 applies force to the top wafer for single point bond initiation with another wafer (not shown) (bottom wafer in the exemplary arrangement of FIGS. 1-6) beneath the wafer being pushed by the pin 110 shown in FIGS. 1-6. Each of the concentric rings 120 is then lowered, in turn, starting from the closest to the center to the farthest from the center (FIGS. 3-6), to apply pressure sequentially on the top wafer. Each of the concentric rings 120 applies uniform pressure at a given radial distance from the center of the top wafer. In prior systems that apply uniform pressure to one or both of the wafers, the simultaneous application of that pressure allows air to remain trapped between pressure application points. By contrast, the sequential application of pressure using the concentric rings 120 allows air to be pushed to the edge of the wafers with the addition of each concentric ring 120 such that the air ultimately exits the gap between the top and bottom wafers. In alternate embodiments, the concentric rings 120 may simultaneously be brought into contact with the top wafer to apply uniform and continuous force resulting in a complete bond. The number and position of the concentric rings 120, as well as the amount of force applied, may be varied to control the dynamics of the applied pressure.

FIGS. 1-6 show the pin 110 and concentric rings 120 being lowered (FIGS. 2-5) and thereby imply an arrangement in which the pin 110 and concentric rings 120 push down a top wafer onto a bottom wafer. This is the arrangement discussed specifically above. However, in alternate embodiments, the pin 110 and concentric rings 120 may be arranged to alternately or additionally push up the bottom wafer to bond with the top wafer. Also, application of force directly on a wafer is discussed herein. However, preferred alternate embodiments contemplate the top wafer sitting on a flexible chuck and the pin 110 and concentric rings 120 applying pressure on top of the flexible chuck which is in contact with the top wafer (or pressure from below a flexible chuck in contact with the bottom wafer) or applying pressure to the top wafer (or bottom wafer) through grooves in a non-flexible chuck.

FIGS. 7-12 depict a wafer bonding apparatus 200 at various stages of a wafer bonding process according to an embodiment. The apparatus 200 includes a central pin 210 and outer pins 220. The central pin 210 is lowered (FIG. 8) onto a wafer 240 (top wafer according to the exemplary arrangement of FIGS. 1-6) for single point bond initiation between the top wafer 240 and the bottom wafer 250. Then, the outer pins 220 are simultaneously lowered onto the top wafer (FIGS. 3-6). As shown by the perspective top view in FIG. 11, the outer pins 220 are lowered onto the top wafer 240 at a given radial distance r1 from the center of the top wafer 240 and the outer pins 220 are then moved radially outward, as indicated by the arrows in FIG. 11, to the outer edge of the top wafer 240 to the position shown at FIG. 12. The outer pins 220 are moved while continuing to apply pressure to the top wafer 240. As such, the outer pins 220 push air to the outer edge of the wafer bond where it exits the gap between the top and bottom wafers rather than being trapped to form a void in the wafer bond. As noted with regard to the previous embodiment, the pins 210, 220 may alternately or additionally be arranged to push up the bottom wafer 250 in alternate embodiments. In the embodiment shown by FIGS. 7-12, the pins 210, 220 apply pressure to the top wafer 240 through grooves in a non-flexible chuck 230 on which the top wafer 240 sits. In alternate embodiments, the pins 210, 220 may apply pressure to a flexible chuck (not shown) in contact with the top or bottom wafer or may pressure directly to the top or bottom wafer without the presence of a chuck. The number and position (e.g., the initial radial distance from the central pin 210 when the outer pins 220 are lowered) of the outer pins 220, as well as the amount of force applied, may be varied to control the dynamics of the applied pressure.

Figure 1:
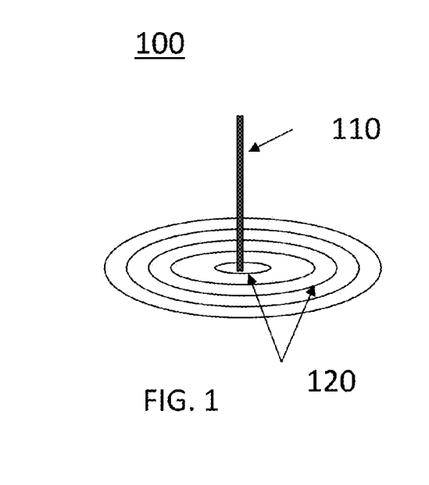
FIG. 1 depicts a wafer bonding apparatus prior to initiation of wafer bonding according to an embodiment.
Figure 2:
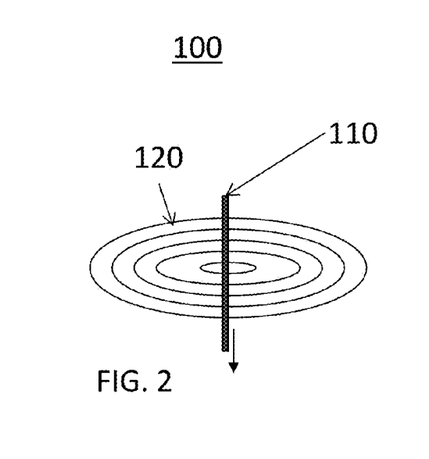
FIG. 2 depicts the wafer bonding apparatus of FIG. 1 at a start of a wafer bonding process.
Figure 3:
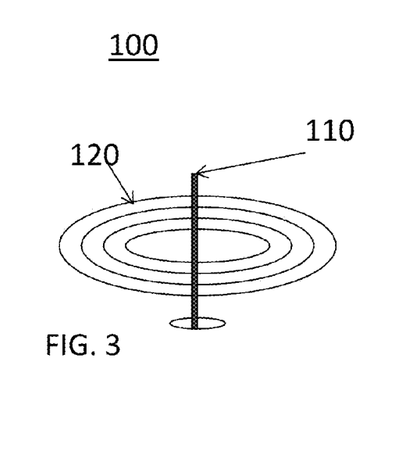
FIG. 3 depicts the wafer bonding apparatus of FIG. 1 during the wafer bonding process.
Figure 4:
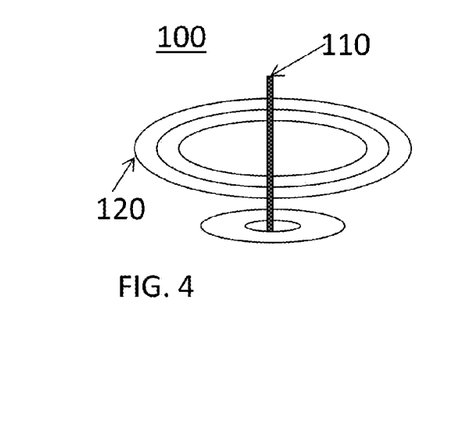
FIG. 4 depicts the wafer bonding apparatus of FIG. 1 during the wafer bonding process.
Figure 5:
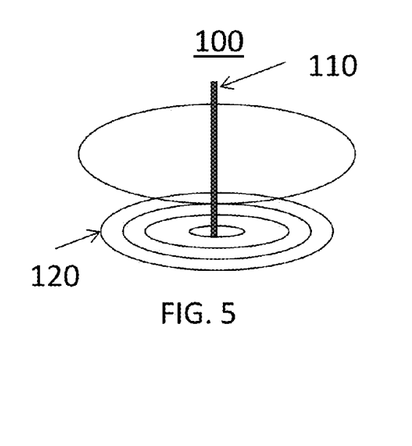
FIG. 5 depicts the wafer bonding apparatus of FIG. 1 during the wafer bonding process.
Figure 6:
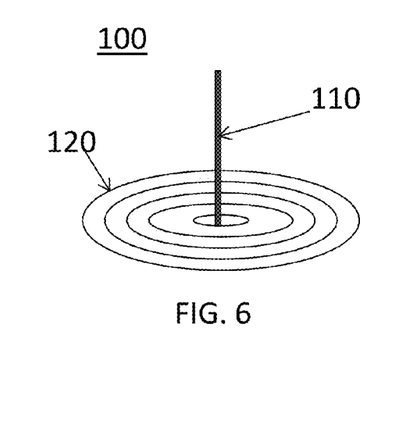
FIG. 6 depicts the wafer bonding apparatus of FIG. 1 at a completion of the wafer bonding process.
Figure 7:
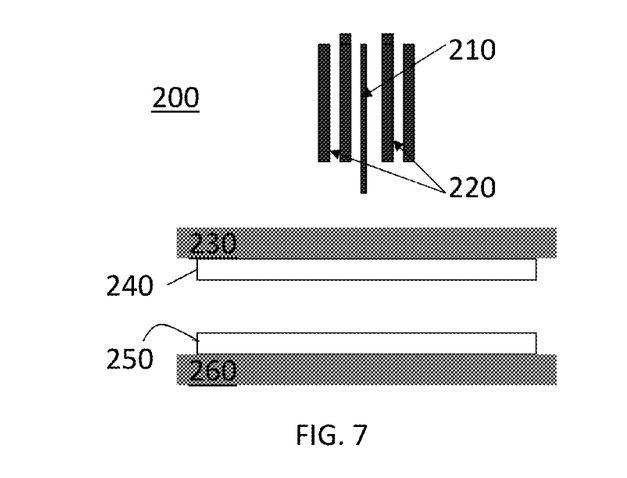
FIG. 7 depicts a wafer bonding apparatus prior to initiation of wafer bonding according to another embodiment.
Figure 8:
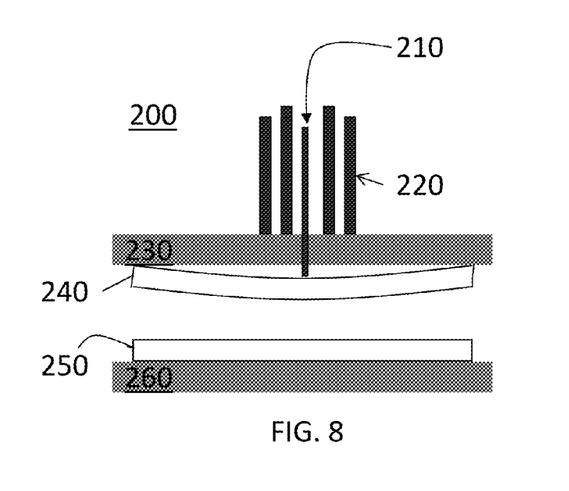
FIG. 8 depicts the wafer bonding apparatus of FIG. 7 at a start of a wafer bonding process.
Figure 9:
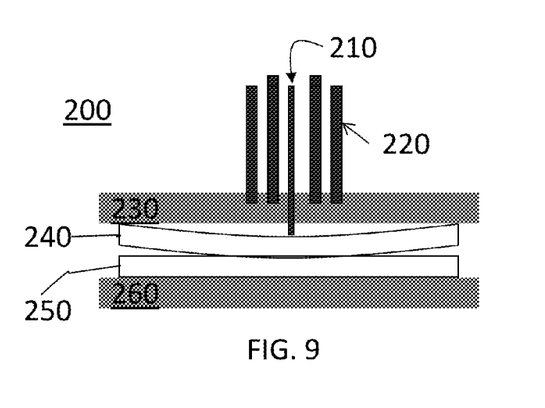
FIG. 9 depicts the wafer bonding apparatus of FIG. 7 during the wafer bonding process.
Figure 10:
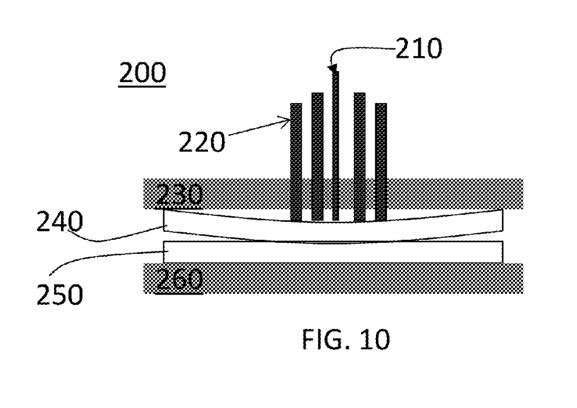
FIG. 10 depicts the wafer bonding apparatus of FIG. 7 during the wafer bonding process.
Figure 11:
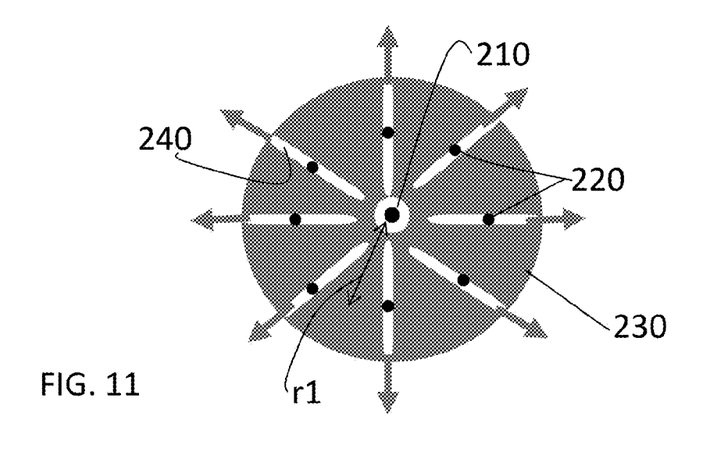
FIG. 11 depicts a perspective top view of the wafer bonding apparatus of FIG. 7.
Figure 12:
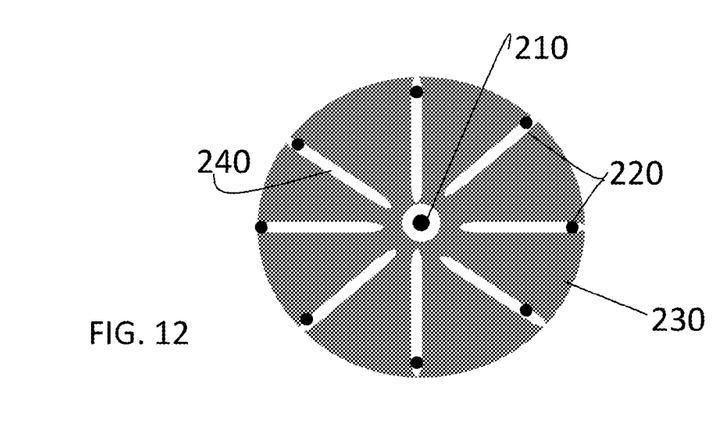
FIG. 12 depicts a perspective top view of the wafer bonding apparatus of FIG. 7 at a completion of the wafer bonding process.
Figure 13:
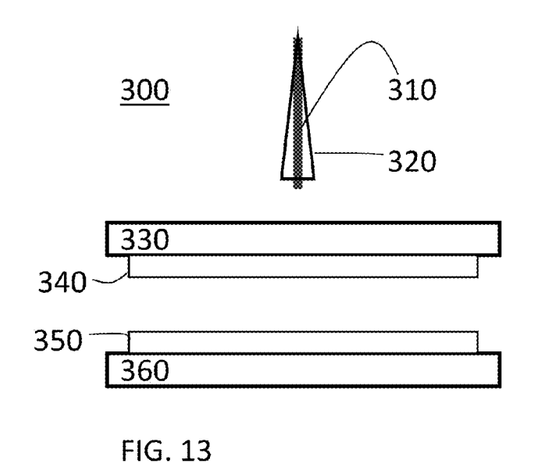
FIG. 13 depicts a wafer bonding apparatus prior to initiation of wafer bonding according to an embodiment.
Figure 14:
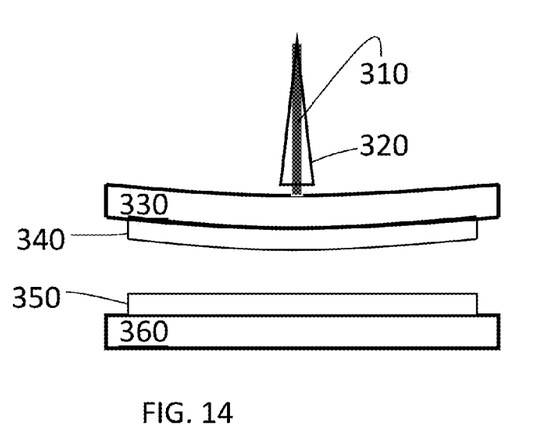
FIG. 14 depicts the wafer bonding apparatus of FIG. 13 at a start of a wafer bonding process.
Figure 15:
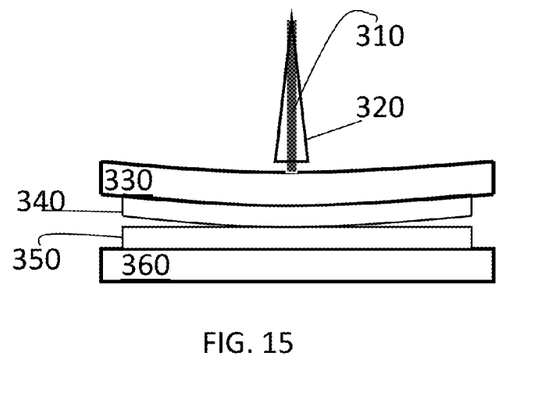
FIG. 15 depicts the wafer bonding apparatus of FIG. 13 during the wafer bonding process.
Figure 16:
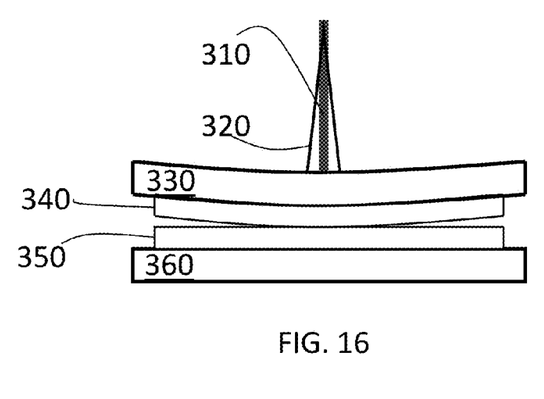
FIG. 16 depicts the wafer bonding apparatus of FIG. 13 during the wafer bonding process.
Figure 17:
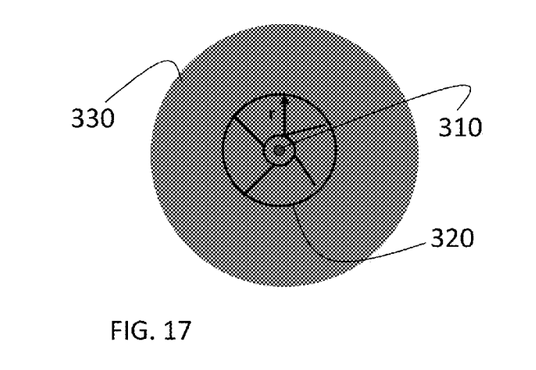
FIG. 17 depicts a perspective top view of the wafer bonding apparatus of FIG. 13 during the wafer bonding process.
Figure 18:
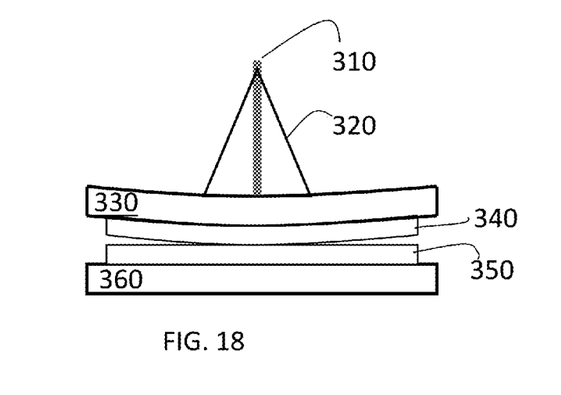
FIG. 18 depicts the wafer bonding apparatus of FIG. 13 during the wafer bonding process.
Figure 19:
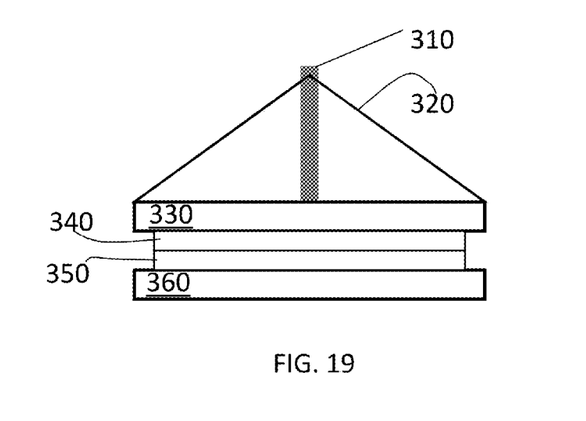
FIG. 19 depicts the wafer bonding apparatus of FIG. 13 at a completion of the wafer bonding process.
Figure 20:
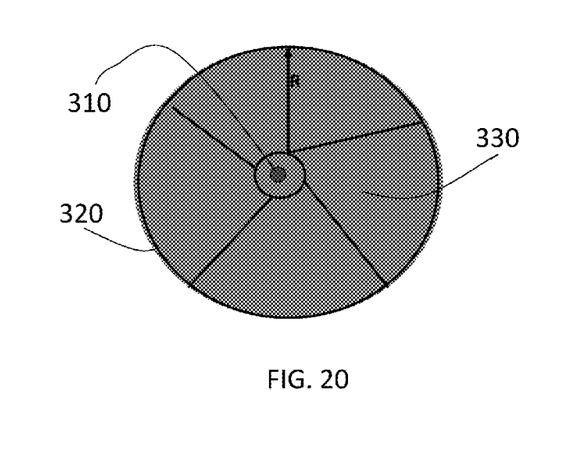
FIG. 20 depicts a perspective top view of the wafer bonding apparatus of FIG. 13 at the completion of the wafer bonding process.
Figure 21:
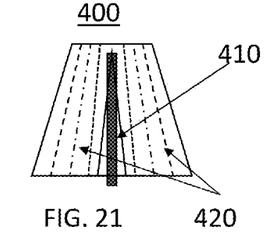
FIG. 21 depicts a wafer bonding apparatus prior to initiation of wafer bonding according to an embodiment.
Figure 22:
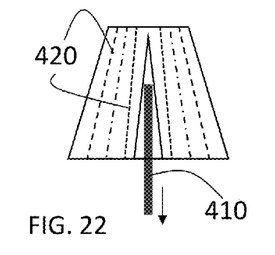
FIG. 22 depicts the wafer bonding apparatus of FIG. 21 at a start of a wafer bonding process.
Figure 23:
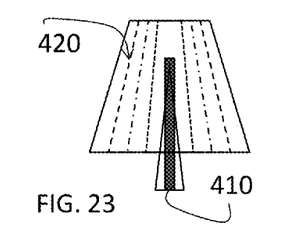
FIG. 23 depicts the wafer bonding apparatus of FIG. 21 during the wafer bonding process.
Figure 24:
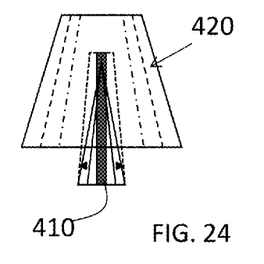
FIG. 24 depicts the wafer bonding apparatus of FIG. 21 during the wafer bonding process.
Figure 25:
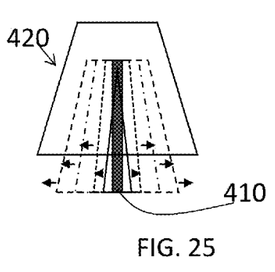
FIG. 25 depicts the wafer bonding apparatus of FIG. 21 during the wafer bonding process.
Figure 26:
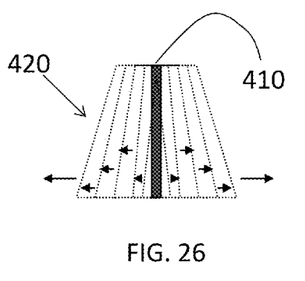
FIG. 26 depicts the wafer bonding apparatus of FIG. 21 at a completion of the wafer bonding process.
Figure 27:
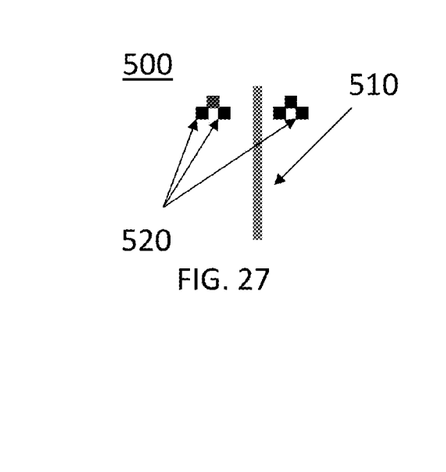
FIG. 27 depicts a wafer bonding apparatus prior to initiation of wafer bonding according to an embodiment.
Figure 28:
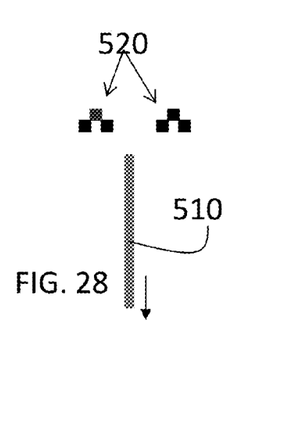
FIG. 28 depicts the wafer bonding apparatus of FIG. 27 at a start of a wafer bonding process.
Figure 29:
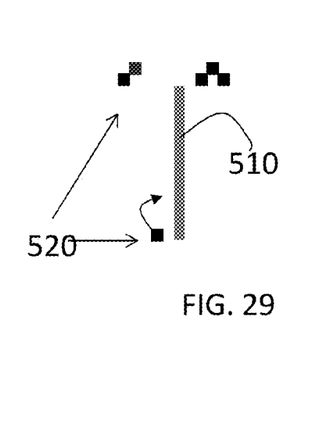
FIG. 29 depicts the wafer bonding apparatus of FIG. 27 during the wafer bonding process.
Figure 30:
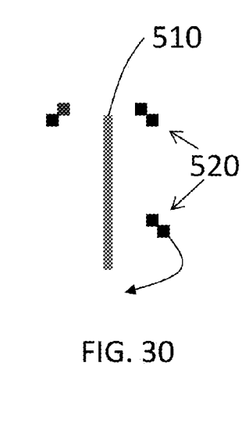
FIG. 30 depicts the wafer bonding apparatus of FIG. 27 during the wafer bonding process.

FIGS. 13-20 depict a wafer bonding apparatus 300 at various stages of a wafer bonding process according to an embodiment. The apparatus 300 includes a pin 310 and a spreading cone 320. In the exemplary illustrations of FIGS. 13-20, the apparatus 300 is used to apply pressure on a flexible chuck 330 in contact with a top wafer 340. In alternate embodiments, force may be applied to the top wafer 340 directly or through grooves in a non-flexible chuck. Also, force may additionally or alternately be applied to a bottom wafer 350 or a flexible chuck 360 on which the bottom wafer 350 is sitting. As shown in FIGS. 13-20, the pin 310 is lowered (FIG. 14) onto a flexible chuck 330 in contact with the top wafer 340 to affect single point bond initiation (FIG. 15) between the top wafer 340 and bottom wafer 350 near the center of the wafer 340, 350. The spreading cone 320 is then lowered onto the chuck 330 (FIG. 16) at a given radial distance (r) from the pin 310 and also applies pressure on the chuck 330 to continue the bonding process between the wafers 340, 350. The top view (FIG. 17) shows the spreading cone 320 initially touching down on the chuck 330 at a radial distance r from the pin 310. As shown at FIGS. 18-20, the circular base of the spreading cone 320 that contacts the chuck 330 then spreads to expand the circular base to a radial distance (R, FIGS. 19 and 20) greater than the initial radial distance (r) from the pin 310 and, ultimately, to the edge of the chuck 330. The continuous application of pressure during the spreading of the circular base of the spreading cone 320 prevents de-bonding or inward movement of air or particles between the top wafer 340 and bottom wafer 350.

FIGS. 21-26 depict a wafer bonding apparatus 400 at various stages of a wafer bonding process according to an embodiment. The apparatus 400 includes a central pin 410 and concentric shapes 420 that may be cones, cylinders, or trapezoids. The central pin 310 is lowered (FIG. 22) onto a wafer (for example, a top wafer according to the exemplary arrangement of FIGS. 21-26) for single point bond initiation between the top and bottom wafers. Then each of the shapes 420 is lowered onto the top wafer and then spread (for example, FIGS. 23 and 24) sequentially. As indicated by the arrows at FIGS. 25 and 26, the lowering and spreading of each shape 420 are done successively for shapes 420 of increasing radial distance from the pin 410. That is, the circular or other-shaped base of each shape 420 that contacts the top wafer as it contacts the bottom wafer in the bonding process spreads radially outward while continuing to apply pressure on the top wafer to continue the bonding process. The spread of each shape 420 may be limited to prevent interference with the next shape 420 (radially farther from the pin 410 than the previously lowered shape 420) that is lowered onto the top wafer. Although described as direct pressure on the top wafer, the pin 410 and shapes 420 may instead apply pressure on a flexible chuck in contact with the top wafer when the top wafer is sitting on a flexible chuck. Also, as discussed with regard to previous embodiments, the pin 410 and shapes 420 may alternately or additionally apply pressure on the bottom wafer or flexible chuck in contact with the bottom wafer. The number and positions of the shapes 420, as well as the amount of force applied, may be varied to control the dynamics of the applied pressure.

Figure 31:
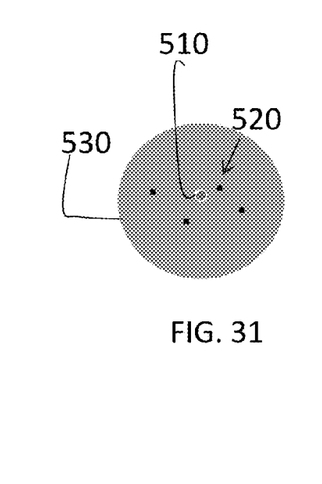
FIG. 31 depicts a perspective top view of the wafer bonding apparatus of FIG. 27 during the wafer bonding process.
Figure 32:
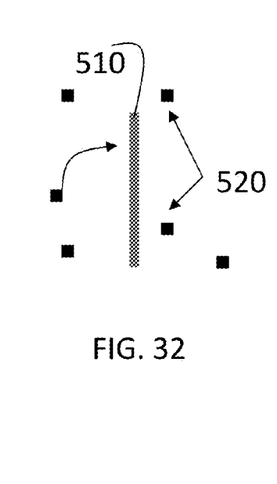
FIG. 32 depicts the wafer bonding apparatus of FIG. 27 during the wafer bonding process.
Figure 33:
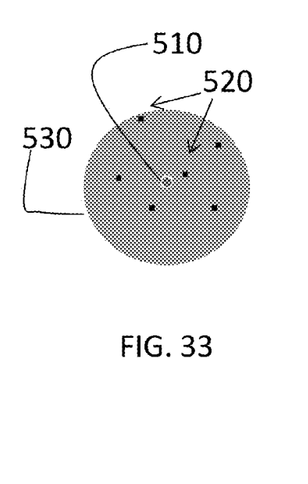
FIG. 33 depicts a perspective top view of the wafer bonding apparatus of FIG. 27 during the wafer bonding process.
Figure 34:
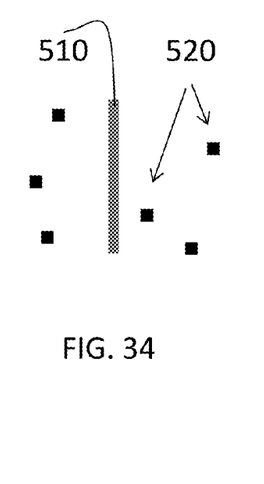
FIG. 34 depicts the wafer bonding apparatus of FIG. 27 at a completion of the wafer bonding process.

FIGS. 27-34 depict a wafer bonding apparatus 500 at various stages of a wafer bonding process according to an embodiment. The apparatus 500 includes a pin 510 and chain links 520. The pin 510 is lowered (FIG. 28) onto a wafer (top wafer 530 according to the exemplary arrangement of FIGS. 27-34) for single point bond initiation between the top and bottom wafers at substantially a center of the bond. Each of the chain links 520 has a spiral motion and can apply force to the top wafer 530. The chain links 520 may be sequentially or simultaneously brought into contact with the top wafer 530 (FIGS. 29-34 show sequential application of force by the chain links 520). When the chain links 520 spiral onto the top wafer 530 sequentially, the application of force by those chain links 520 as well as the continuing application of force by chain links 520 already on the top wafer 530 prevents de-bonding of already bonded portions. The perspective top views shown by FIGS. 31 and 33 illustrate that the chain links 520 land on various parts of the top wafer 530 to collectively apply randomly distributed pressure on the top wafer 530. Although described as direct pressure on the top wafer 530, the pin 510 and chain links 520 may instead apply pressure on a flexible chuck in contact with the top wafer 530 when the top wafer 530 is sitting on a flexible chuck or in grooves of a non-flexible chuck when the top wafer is sitting on a non-flexible chuck. Also, as discussed with regard to previous embodiments, the pin 510 and chain links 520 may alternately or additionally apply pressure on the bottom wafer or on a flexible chuck in contact with the bottom wafer. The number of chain links 520 and the amount of force applied by each chain link 520 may be varied to control the dynamics of the pressure applied.

Figure 35:
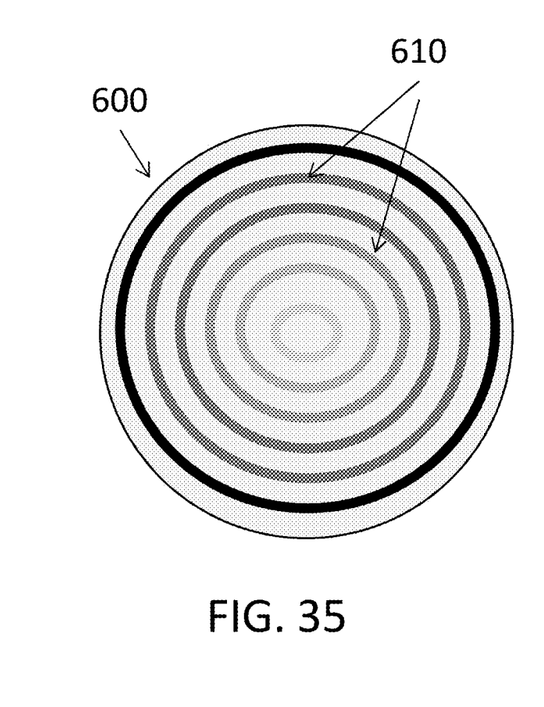
FIG. 35 depicts a perspective top view of a chuck used in wafer bonding according to an embodiment.
Figure 36:
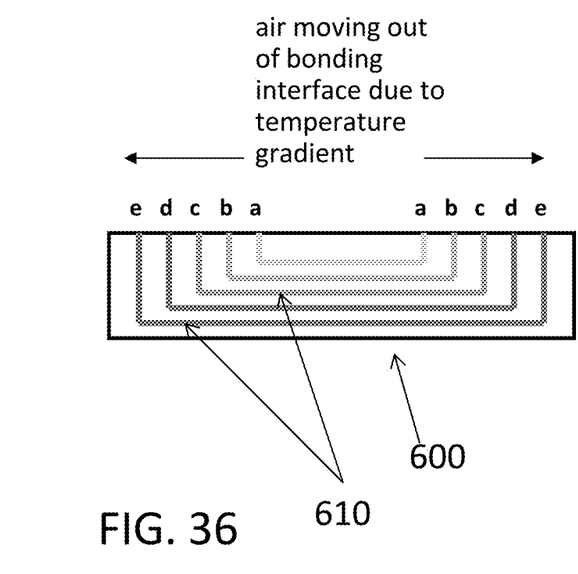
FIG. 36 depicts a perspective side view of the chuck shown in FIG. 35 according to an embodiment.

FIGS. 35 and 36 depict perspective top and side views, respectively, of a chuck 600 used in wafer bonding according to an embodiment. The chuck 600 includes concentric rings 610 used for temperature control of the chuck 600. The chuck 600 represents both the top chuck 600 on which the top wafer sits and the bottom chuck 600 on which the bottom wafer sits. The concentric rings 610 control the temperature of the chuck 600 during bonding of the two wafers to prevent uneven expansion. That is, the temperature control enhances void-free bonding by expelling air from between the two wafers as discussed herein. The concentric rings 610 may be used to create a temperature gradient across the wafer surface as the bond propagates. That is, a higher temperature is applied to the chuck 600 at smaller radial distances from the center (the concentric ring 610 closest to the center of the chuck 600 has the highest temperature) and temperatures of the concentric rings 610 are lowered as radial distances from the center increase. In this way, the higher temperature at the bond initiation point (center) helps to heat and expand air outward toward the edge of the bond where relatively lower temperature areas are created by concentric rings 610 at increasing radial distances. The temperature of each concentric ring 610 may be varied as the bonding process propagates from the center out to the edges. That is, the temperature of each concentric ring 610 successively farther from the center may be increased during the bonding process.

Figure 37:
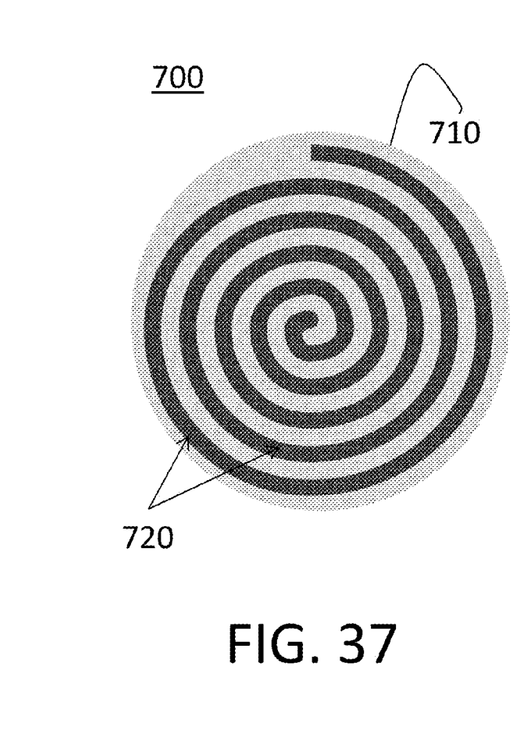
FIG. 37 depicts a chuck with a heating coil according to an embodiment.
Figure 38:
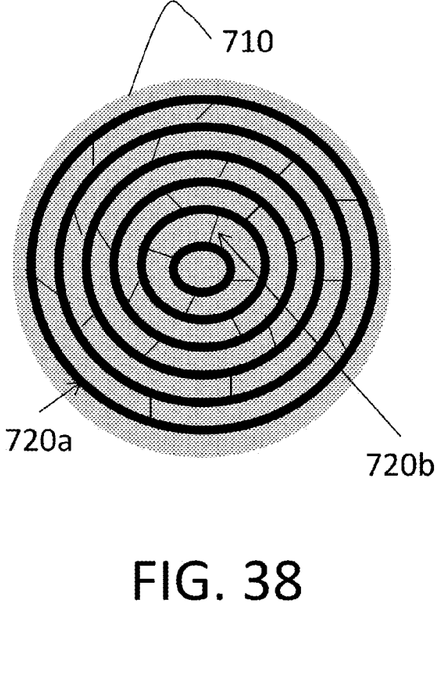
FIG. 38 depicts a chuck with heating rings and spikes according to an embodiment.
Figure 39:
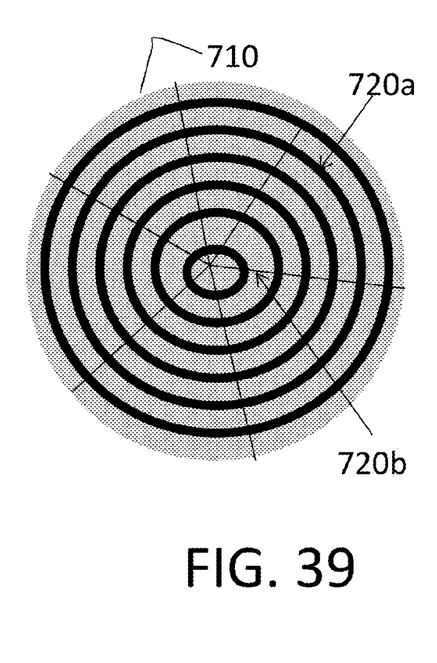
FIG. 39 depicts a chuck with heating rings and spikes according to another embodiment.
Figure 40:
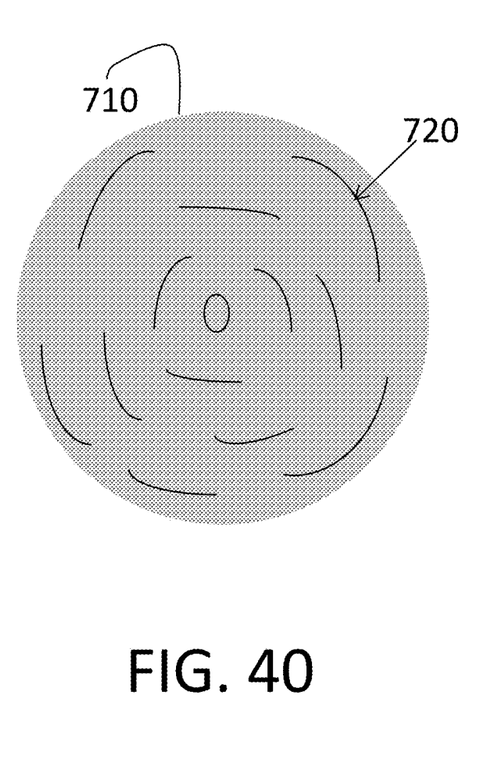
FIG. 40 depicts a chuck with randomly arranged heating elements according to an embodiment.
Figure 41:
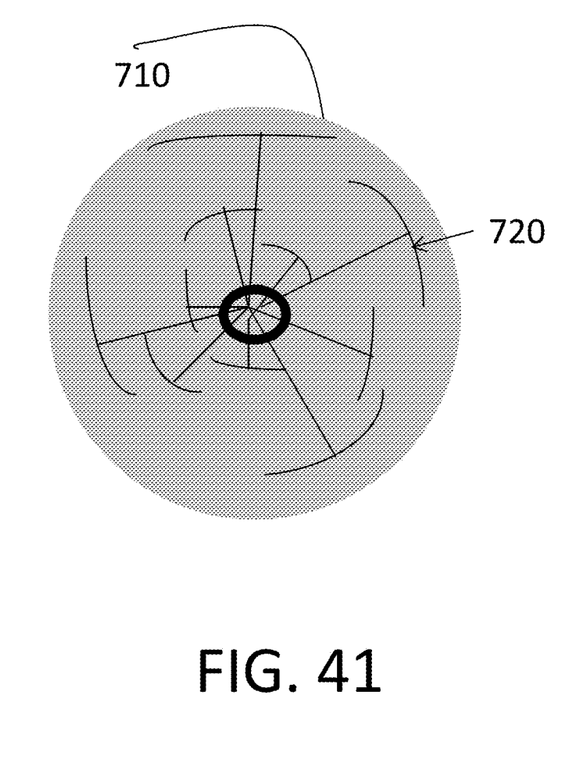
FIG. 41 depicts a chuck with randomly arranged heating elements according to another embodiment.

FIGS. 37-41 depict various embodiments of a temperature module 700 including a chuck 710 and one or more heating elements 720. Each of the embodiments may represent a top or bottom chuck 710. The embodiments depicted by FIGS. 37-39 enhance uniformity of heating of the chuck 710 and thus discourage air gaps between the wafers during bonding. FIG. 37 includes heating elements 720 formed of a coiled temperature control filament. The coiled heating elements 720 mitigate uneven expansion during the bonding process which may pull air gaps to one side of the wafer bond. As discussed with reference to FIGS. 35 and 36, a temperature gradient may be created from the center (point of bond initiation) to the outer edge of the chuck 710. FIGS. 38 and 39 depict heating elements 720 that include concentric rings 720a and radial spikes 720b whose temperature may be individually controlled. The embodiment shown by FIG. 38 includes fragments of radial spikes 720b while the embodiment shown by FIG. 39 includes continuous radial spikes 720b. By controlling the temperature of the radial spikes 720b to be the same or successively higher toward the center of the chuck 710, a uniform temperature or a temperature gradient, respectively, may be created on the chuck 710 as needed to enhance the wafer bonding process. FIGS. 40 and 41 depict heating elements 720 in random configurations. These heating elements 720 can be individually controlled to create a uniform or variable temperature across the chuck 710 as needed to expel air from between the wafers during bonding and ensure that air pockets (voids) are not created as a source of weakness in the bond.

Figure 42:
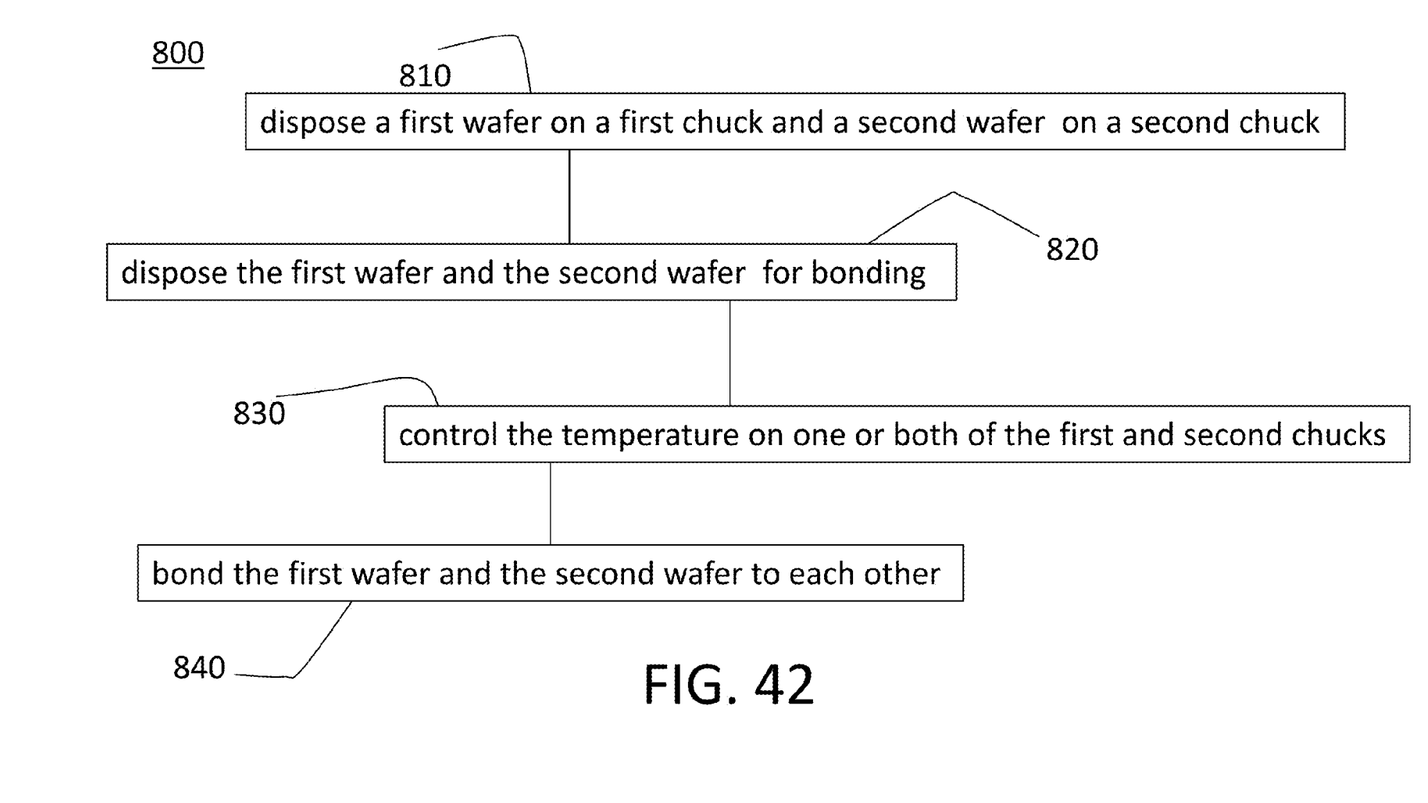
FIG. 42 depicts processes involved in a wafer bonding process according to various embodiments.

FIG. 42 depicts processes 800 involved in wafer bonding according to various embodiments. At block 810, the processes 800 may include disposing a first wafer on a first chuck and disposing a second wafer on a second chuck. Whether the wafers are attached to a chuck or not, disposing the first wafer and the second wafer for bonding at block 820 includes arranging the radial plane of the first and second wafers to be substantially parallel and also lined up such that they can be moved together to bond. The first wafer may be arranged on top of the second wafer, for example, such that pressure may be applied down on the top wafer while the second (bottom) wafer is held in place or moved up to meet the top wafer. When one or more of the first and second wafers is mounted on a chuck, the processes 800 may include controlling the temperature one or both of the chucks at block 830. The temperature control can aid in void-free bonding by moving air out from between the wafers, as discussed with reference to FIGS. 35-41. At block 840, bonding the first wafer and the second wafer to each other may be accomplished by any of the embodiments discussed with reference to FIGS. 1-34.

Figure 43:
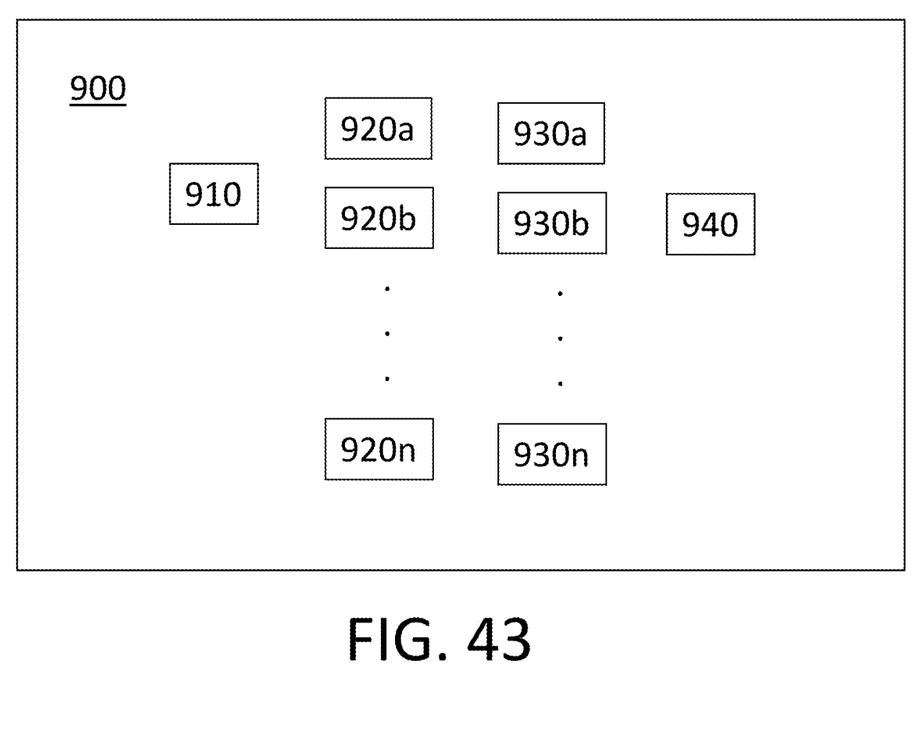
FIG. 43 is a block diagram of a wafer bonding system according to various embodiments.

FIG. 43 is a block diagram of a wafer bonding system 900 according to various embodiments. The wafer bonding system 900 includes a first pressure application device 910. In various embodiments discussed above, the first pressure application device is, for example, a pin. The wafer bonding system 900 also includes one or more second pressure application devices 920. In various embodiments discussed above, the second pressure application devices include pins, cones, cylinders, trapezoids, and chain links, for example. The heating elements 930 discussed with reference to FIGS. 35-41 above are disposed on one or both chucks on which one or both of the wafers being bonded sit. In various embodiments discussed above, the heating elements are disposed as concentric rings, with and without radial spikes, a spiral, and a random arrangement. The controller 940 controls the first and second pressure application devices and affects not only when the first and second pressure application devices begin applying force but also how much force is applied. The controller 940 also controls the heating elements 930 and controls whether uniform heat or a temperature gradient is applied and also determines the timing of any temperature gradient that is varied during bonding.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagram depicted herein is just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An apparatus to bond a first wafer to a second wafer, the apparatus comprising:
   a first pressure application device configured to apply pressure at a central region of the first wafer in a direction toward the second wafer to initiate a bonding process between the first wafer and the second wafer;
   one or more second pressure application devices configured to apply pressure between the central region and an outer edge of the first wafer to complete the bonding process, wherein the one or more second pressure application devices apply pressure on the first wafer in the direction toward the second wafer after the first pressure application device has initiated the bonding process and while the first pressure application device continues to apply pressure at the central region,
   wherein the first pressure application device includes a pin and the second pressure application devices include a set of pins arranged to encircle the pin at a first radial distance from the pin,
   wherein the set of pins is arranged to begin applying pressure on the first wafer simultaneously, and each of the set of pins is arranged to move radially outward to a second radial distance from the pin, and
   wherein the set of pins is arranged to continue to apply pressure on the first wafer while moving from the first radial distance to the second radial distance; and
   a controller configured to control an amount of pressure applied by the first pressure application device and the one or more second pressure application devices on the first wafer in the direction toward the second wafer.

2. The apparatus according to claim 1, further comprising a chuck on which the first wafer sits, wherein the chuck is flexible and the first pressure application device and the one or more second pressure application devices apply pressure on the first wafer through the chuck.

3. The apparatus according to claim 1, further comprising a chuck on which the first wafer sits, wherein the chuck is non-flexible and the first pressure application device and the one or more second pressure application devices apply pressure on the first wafer through grooves in the chuck.

4. The apparatus according to claim 1, further comprising the first pressure application device and the one or more second pressure application devices configured to apply pressure on the second wafer.

5. The apparatus according to claim 1, wherein the first wafer is disposed above the second wafer and the first pressure application device and the one or more second pressure application devices is configured to apply downward pressure on the first wafer to bond with the second wafer.

6. The apparatus according to claim 1, wherein the first pressure application device is a pin and the second pressure application devices are links on a chain that spiral down, sequentially, to apply pressure on the first wafer.

7. The apparatus according to claim 1, wherein one or both of the first wafer and the second wafer sits on a corresponding chuck including temperature control elements to heat the chuck uniformly or with a radially progressive temperature gradient.

8. The apparatus according to claim 7, wherein the temperature control elements are formed as concentric rings.

9. The apparatus according to claim 8, wherein the temperature control elements are further formed as radial spikes.

10. The apparatus according to claim 7, wherein the temperature control elements are formed as a coil.

11. The apparatus according to claim 7, wherein the temperature control elements are randomly arranged on the chuck.

12. An apparatus to bond a first wafer to a second wafer, the apparatus comprising:
   a first pressure application device configured to apply pressure at a central region of the first wafer in a direction toward the second wafer to initiate a bonding process between the first wafer and the second wafer;
   one or more second pressure application devices configured to apply pressure between the central region and an outer edge of the first wafer to complete the bonding process, wherein the one or more second pressure application devices apply pressure on the first wafer in the direction toward the second wafer after the first pressure application device has initiated the bonding process and while the first pressure application device continues to apply pressure at the central region,
   wherein the first pressure application device includes a pin and the second pressure application device includes a cone, and
   wherein a circular base of the cone is arranged to begin applying pressure on the first wafer at a first radial distance from the pin, and the cone is arranged to spread radially outward to a second radial distance from the pin, and
   wherein the cone is arranged to continue to apply pressure on the first wafer while the circular base of the cone moves from the first radial distance to the second radial distance; and
   a controller configured to control an amount of pressure applied by the first pressure application device and the one or more second pressure application devices on the first wafer in the direction toward the second wafer.

* * * * *